Oct. 9, 1962 F. F. GANS 3,057,762

HETEROJUNCTION TRANSISTOR MANUFACTURING PROCESS

Filed March 11, 1959 2 Sheets-Sheet 1

INVENTOR
Francois F. Gans
BY
Abraham A. Saffitz
ATTORNEY

HETEROJUNCTION TRANSISTOR MANUFACTURING PROCESS

Filed March 11, 1959 2 Sheets-Sheet 2

INVENTOR
Francois F. Gans
BY
Abraham A. Saffitz
ATTORNEY

United States Patent Office 3,057,762

Patented Oct. 9, 1962

3,057,762
HETEROJUNCTION TRANSISTOR MANUFACTURING PROCESS

François F. Gans, Rue Gustave Vatonne, Gif-sur-Yvette, France

Filed Mar. 11, 1959, Ser. No. 798,700
Claims priority, application France Mar. 12, 1958
3 Claims. (Cl. 148—33)

Figure 1:
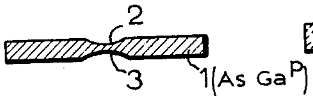

The invention relates to semiconductor devices in which at least two semiconductive regions of different conductivity types form a junction between one another and thus produce a barrier layer, and more particularly to devices of said kind in which the semiconductive regions are made of two dissimilar semiconductors grown parallel onto each other. Still more particularly, at least one semiconductive region consists of an elementary semiconductor conventional material, namely germanium, and at least another semiconductive region consists of an $A_{III}B_{V}$ semiconductor compound. Junctions between two dissimilar semiconductors will be referred to hereinafter as heterojunctions contrary to those in the same semiconductor with different doping which are generally referred to as homojunctions.

It is known in the art to make transistors by the surface melting techniques consisting of depositing small quantities of a suitable metal, indium for example, on both faces of a carrier body of germanium having a thickness of about 50 microns, of fusing indium at a temperature comprised between the melting point of indium (155° C.) and the melting point of germanium, then of allowing it to cool. When the indium in contact with the body of germanium is in liquid condition, it is capable of dissolving a portion of the germanium body. Consequently, the molten droplet formed on the carrier body consists of germanium as well as indium. During the subsequent cooling of the droplet, the solubility of germanium in indium decreases so that an increasing amount of the dissolved germanium is segregated in solid form. The segregated germanium grows up from the carrier body of germanium because this body acts as a crystal germ. The electrical properties of the grown germanium, however, are essentially different and distinct from those of the carrier body because, during segregation, indium atoms are built as acceptors into the germanium lattice. Consequently, if the carrier body is N-conductive, the segregated portion of the germanium may be P-conductive so that a P–N junction suitable for transistor application is produced.

This process is easy to work; the welding of the electrode lead to the base is easy, but the repeatability of transistors is difficult to achieve. In fact the penetration of the indium droplet into the germanium body rapidly varies with temperature. Consequently, the temperature must be regulated with accuracy in order to give to the base electrode a reliable and repeatable thickness. Besides, the surface of the droplet of the In-Ge alloy has a tendency to take a curved shape and it is difficult, by the surface melting techniques, to obtain plane and parallel junctions.

It is of course desirable to melt added layers of germanium, on the surface of a germanium carrier body having a given type of conductivity, without causing said body to melt, these layers constituting a first layer of germanium of the opposite type of conductivity in order to constitute the emitter and a second layer of germanium of the same type as the first layer to constitute the collector and, then to allow the two molten layers to recrystallize forming a single monocrystal with the carrier body.

In this case and assuming, in order to fix one's idea, that it is desired to obtain a concentration of $10^{17}$ impurities per cm.$^3$ in the collector region, it is sufficient, if the chosen impurity has a segregation factor of an order of 0.01, to melt onto the carrier body a droplet of germanium containing about $10^{19}$ impurities per cm.$^3$. Then when the droplet has recrystallized, a crystalline region is obtained having in the vicinity of the junction a practically constant concentration in the range of $10^{17}$ impurities per cm.$^3$.

Such a melting operation is of course impossible to achieve if it is tentatively attempted to melt a drop of P-type germanium adapted to form the emitter or the collector of the transistor, onto the base of a N-type carrier body adapted to form the base since the melting temperature varies almost insignificantly with respect to the impurity concentration. In this case, when the emitter and collector drops are melted, the base also melts and either the structure is completely destroyed or a region having dimensions which cannot be ignored (several hundreds of microns) is built up in which there are simultaneously N type and P type impurities. This is quite unfavorable to the object of providing a good junction.

The object of the invention is to overcome the technical difficulties which are encountered in depositing, by a melting technique, germanium layers epitaxially on germanium substrates, and these difficulties are overcome by replacing the germanium substrate by a substrate of a semiconductor compound having the same crystal lattice as germanium and a reticular distance or lattice spacing very closely approximating that of germanium, but showing a melting point substantially higher than that of germanium whereby the melting and alloying of germanium with the semiconductor compound substrate is thus avoided.

It is known that metals or intermetallic compounds having the same crystal lattice and reticular interatomic distances presenting but slight misfit percentagees give rise to the phenomenon of epitaxy or parallel growth (see "Crystal Growth" by A. E. Buckley, John Wiley and Sons, Inc., New York, 1951, pages 402 and seq., and "Advances in Physics," "The Study of Epitaxy in Thin Surface Films," by D. W. Paschley, vol. 5, April 1956, page 199).

According to the invention, the material for the formation of at least one semi-conductive region is a binary compound selected from the group comprising gallium arsenide (lattice spacing 2,435 A.; melting point 124° C.), indium phosphide (lattice spacing 2,44 A.; melting point 1070° C.) and the material for other regions is suitably doped germanium which is melted onto the former material and recrystallizes by an epitaxy process while following the crystal lattice of said former material.

The semi-conductor devices of the invention are heterojunction devices in that sense that at least two semiconductive regions are constituted by dissimilar semiconductive materials. Disregarding the impurity materials which are added to a semi-conductive body so as to obtain a chosen conductivity type, the bulk of the body consists of a single semi-conductor, such as elemental germanium or silicon which are most often used and of binary compounds known as $A_{III}B_{V}$ compounds. Some attempts have been made heretofore to make heterojunction semi-conductor devices in particular cases. For example, it has been proposed to fabricate semi-conductor devices comprising a semi-conductive body consisting of $A_{III}B_{V}$ forming two regions of opposite conductivity type, one of said regions being obtained by doping said compound by means of impurity atoms of a given element together with a semi-conductive layer consisting of another compound including said impurity element and one of the constituents A or B of said $A_{III}B_{V}$ compound. It has also been proposed to fabricate semi-conductive devices comprising a semi-conductive body consisting of a $A_{III}B_{V}$ compound and a semi-conductive resolidified segregate consisting of the same compound having dissolved amounts of the metallic element included in the compound. Only the first named semi-conductive devices are heterojunction devices since the semi-conductor materials of the different semi-conductive regions are different ones and not the same material differently doped but, in the said devices, the semi-conductor materials are all binary compounds having a common element. In the devices of the invention, at least one semi-conductive region consists of an elemental material, namely germanium and at least another consists of a $A_{III}B_V$ compound having substantially the same crystal lattice as germanium and a melting point which is substantially higher.

The invention will now be described in detail by reference to the accompanying drawings in which:

FIGS. 1 to 6 are relative to transistors having a base constituted by a semi-conductor material selected from the abovementioned group and two electrodes of germanium; and FIGS. 7 to 12 are relative to transistors having two electrodes constituted by a semi-conductor material selected from the above-mentioned group and a third electrode of germanium.

Figure 2:
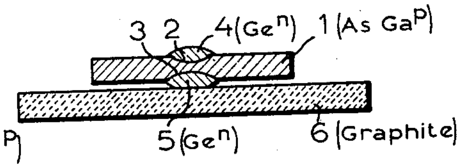
Figure 3:
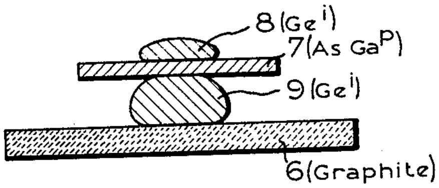

Referring now to FIGS. 1 and 2, the base of the transistor is formed by a square slice 8 mms. long and 50 microns thick, cut in one of the above mentioned substances, AsGa, InP or Ge-Si alloy crystal. On the center of this slice there are two depressions or concave indentations placed on either sides so as to reduce to a minimum the thickness of the base. It is possible to produce these depressions by means of an etching agent, for example that known as $CP_4$. The depression 2 intended for placing the emitter is smaller than the depression 3 intended for the collector. Both are separated by a region about 25 microns thick, forming the base.

In each depression 2 and 3 a small pellet of Ge is being placed, respectively 4 and 5, mono or polycrystalline with as large a diameter as that of the depression but slightly thicker. For instance, pellet 4 which will become the emitter has a diameter of 1 mm. and is 0.1 mm. thick, and pellet 5 which will become the collector has a diameter of 2 mms. and is 0.2 thick.

To give a more detailed example, the concentrations and resistivities of emitter, of base and of collector are as follows:

| | Nature of semi-conductor | Concentration of impurities per cm.$^3$ | Resistivity, ohm cm. |
|---|---|---|---|
| emitter | Ge | $10^{18}$ | 0.01 |
| base | AsGa | | 5 |
| collector | Ge | $10^{17}$ | 0.5 |

The combination of the slice and the two pellets is now placed onto a plate 6 of pure graphite. The whole is placed in a heating chamber either evacuated or filled with a non oxidizing atmosphere such as helium, at a temperature slightly higher (10 to 30° C.) than the melting point of germanium, but much lower than the melting point of the substance constituting the base (1240° C.). The germanium melts and fills the depressions. The whole is slowly cooled down; owing to epitaxy the germanium crystallizes onto the single crystal lattice structure of the unmelted base of AsGa. Once the crystallization is over, it will suffice to cleanse and cut the transistor by the usual means, and then to solder the leads as usual.

Instead of melting doped germanium, it is possible to use intrinsic germanium which will afterwards be activated by the diffusion method.

In that case, it is better not to hollow AsGa plate 7 (FIG. 3) with depressions similar to depressions 2 and 3 of FIG. 1. When germanium has crystallized onto the crystal lattice of AsGa, and when the whole has cooled down, droplets 8 and 9 are ground with emery and etched either chemically or electrochemically, and their thickness is thus reduced to respectively 100 microns and 500 microns so as to produce layers 10 and 11 shown in FIG. 4.

Figure 4:
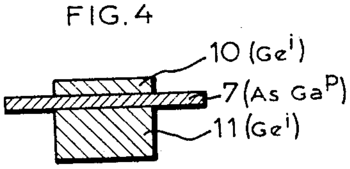
Figure 5:
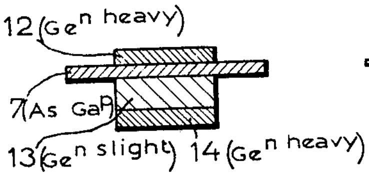
Figure 6:
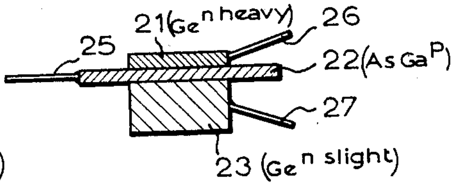
Figure 7:
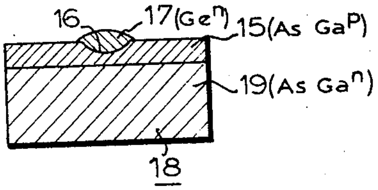

The structure shown on FIG. 4 is then taken to a chamber containing an atmosphere of arsenical vapor heated at 800–850° C. The operation is pursued until arsenic has deeply penetrated both layers of germanium, which will last about 4 hours at 800° C. Then the operation is stopped. We have thus produced the structure sketched on FIG. 5;

A layer 12 of heavily N-doped Ge.
A layer 7 of AsGa of P-type.
A layer 13 of weakly N-doped Ge.
A layer 14 of heavily N-doped Ge.

Of course this is but a rough sketch, the rate of donor impurities varying in a non-discontinuous way between 13 and 14.

Then by grinding and etching layer 14 is then removed and the whole is heated again at 800°–850° C. in a non oxidizing atmosphere (argon for instance) in a chamber in which we have placed a piece of arsenic activated germanium, with a resistivity of about 0.01 ohm-cm., and it is then left alone until, by diffusion, the rate of impurities, becomes homogeneous in 12 and 13. The said piece of arsenic activated germanium is placed in the chamber in order to produce a certain pressure of arsenical vapor to avoid arsenic loss, during this homogenizing operation; otherwise; the arsenic could be removed from the transistor while being handled during this heating operation.

We have then the structure (FIG. 6):

A layer 21 of heavily activated N-germanium (resistivity ca. 0.01 ohm-cm.).
A layer 22 of AsGa of P-type (resistivity ca. 5 ohm-cm.).
A layer 23 of weakly activated N-germanium (resistivity ca. 0.5 ohm-cm.).

It is then sufficient to etch the whole by the usual means in order to cleanse it, to solder the leads 25, 26, 27, which is not very difficult, regions 21 and 23 being about 50 to 100 microns thick.

It is known from an article of Herbert Kroemer in Proceedings of the Institute of Radio-Engineers, November 1957, entitled "Theory of a Wide-Gap Emitter for Transistors," that the emitter of a transistor can be characterized by the fraction of the total emitter current to the minority-carrier injection current and that said factor may be increased by using an emitter material with a wider band gap than the base material. To this respect, the transistors of FIGS. 2 and 6 which have an emitter in germanium and a base in gallium arsenide will not develop good injection properties.

Transistor structures having a base in germanium and emitter and collector in gallium arsenide will now be disclosed.

Then by means of any procedure such as crystal pulling, alloying or diffusing, but preferably through the first, I prepare a P-N diode 18 (FIG. 7) made of one of the previously indicated substances.

For instance an AsGa crystal with a P-N junction, may be produced by pulling according to known procedures (cf. Gremmelmaier, Zeitschrift für Naturforschung, 1955, *10a*, page 501). This crystal has two regions 15 and 19 of respectively P-type and N-type. The said crystal is then removed from its bath, cooled, and then ground in order to reduce that part of the crystal which is to become the base (region 15 for instance). After this grinding operation, performed with fine emery powder, the structure is etched with $CP_4$. The final thicknes is thus brought to 40 to 50 microns.

A small mass of mono or polycrystalline pre-activated germanium is then placed in a cavity 16 of region 15 thus etched, and it is brought to a temperature just above (ca. 10° C.) its melting temperature (958° C.) and it is left to crystallize again. As in the first method of production, owing to epitaxy, the germanium crystallizes onto the AsGa crystal lattice structure. An N-P-N transistor has thus been achieved which is then handled by the usual procedure.

Intead of using a pre-doped N-type germanium, it is also possible to make a droplet of intrinsic germanium crystallize on region 15 of the diode 18 in gallium arsenide. Then, as before, the whole is first placed into arsenical vapor in order to cause the donor impurities to penetrate so as to form an N type heavily activated layer 20 and then in a non-oxidizing atmosphere in order to equalize the impurity rate through the whole volume of the germanium crystal (FIG. 8).

It will be noticed that if that homogenizing operation in a non-oxidizing atmosphere is not performed, and provided the thickness of the germanium crystal, the diffusion temperature and the duration of the operation are well chosen, it is possible to obtain an N-P-I-N structure. It is known that, theoretically, transistors of that type should possess very interesting properties but that attempts to produce them fail to produce a practical result. The present invention makes this structure possible and practical.

Figure 8:
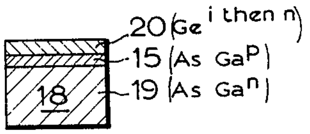

A structure of that kind may be produced by heating during ten hours in arsenic vapor at 800° C. an N-P-I structure of the kind of FIG. 8 in which an intrinsic crystalline layer 20 of about 200 microns thick will have been left.

Figure 9:
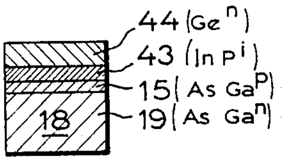
Figure 10:
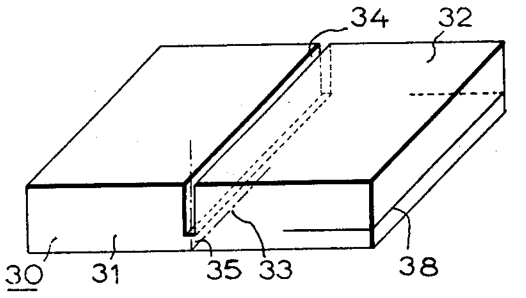
Figure 11:
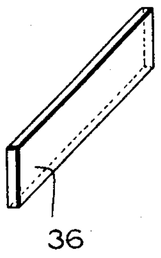
Figure 12:
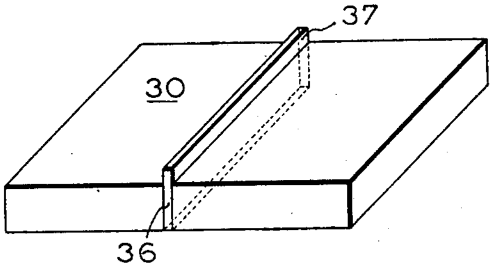

As it is rather difficult to control the operation, the matter may be dealt with by using twice the epitaxy process of the present invention (FIG. 9).

On a junction diode 18 in gallium arsenide (melting point 1240° C.) prepared as shown in the case of FIG. 8, that is to say with a rather thick N-type part 19 and a P-type part 15 of about 50 microns thick, one first causes to crystallize a crystal 43 of intrinsic indium phosphide having a melting point of 1070° C. half-way between that of gallium arsenide and that of germanium. Once this crystal has been formed, it is ground and etched so as to make it only about 25 microns thick; then on the etched surface thus obtained one causes to crystallize a droplet 44 of intrinsic germanium which is first brought down to the required thicknes of ca. 100 microns and then to the N-type by means of the above described procedure. It only remains then to cleanse the structure and to solder the connection leads.

In a slightly different procedure (FIGS. 10, 11 and 12), the starting structure is a gallium arsenide monocrystal of the same type of conductivity therethrough but in which the rate of impurities possesses two different values on either sides of a plane. Such a crystal may be obtained by means of the two-chamber furnace of Gremmelmaier, by varying, as the crystal is being pulled the temperature of the cold part of the furnace.

Slices of the crystal are prepared by any of the usual methods such as diamond sawing, electrochemical slicing or ultrasonic impact slicing. Slices have for example the following dimensions: thickness 3 mms., length 20 mms., width 15 mms.

One takes a slice 30 containing two parts of the same type of conductivity, but having different resistivities, one 31 of low resistivity ($10^{-2}$ ohm-cm. for example) designed to form the emitter, the other 32 of slightly higher resistivity ($10^{-1}$ ohm-cm. for example) designed to become the collector. The separating plane between parts 31–32 is designated by reference numeral 33. The slice is cut by a groove 34 located along plane 33. This groove has parallel faces and a thickness of about 60–80 microns. A solid portion 35, about 1 mm. thick, is allowed to rest at the bottom of the groove. The groove may be achieved by means of any usual procedure such as mechanical shaping techniques, electrolytic shaping techniques with true metallic or virtual cathodes (see Uhlir, Review of Scientific Instruments, 26, pp. 965–968, 1955 and the Bell System Technical Journal, 35, pp. 333–347, March 1956) or jet-etching techniques. It is known that, when mechanical shaping techniques are used, the surface of the semiconductor is damaged and no longer suitable for parallel growth. The damaged material is then to be removed by a short electrolytic etching step.

When the groove has been made, a blade 36 of P-type germanium is inserted therethrough. The dimensions of this blade are approximately the following: thickness 50–70 microns (lower by about 10 microns than the thickness of the groove length 15 mms., width 5 mms. It is to be noted that the width of the blade is slightly more important than the depth of the groove so that the blade should protrude when it is inserted in the groove and pushed to the bottom thereof as shown at 37 in FIG. 12.

The whole is then heated to a temperature higher than the melting point of germanium (958° C.), but lower than the melting point of gallium arsenide and preferably near the melting point of germanium. In practice, a temperature of round 1,000° C. will be chosen. The germanium melts into the groove.

The whole is then left to cool. The germanium crystallizes in the groove while following the crystal lattice of gallium arsenide.

Then by grinding according to a known procedure and etching with $CP_4$, the part of the slice which is below level 38 is removed allowing thus to be removed the portion 35 of gallium arsenide which would otherwise shortcircuit the structure. There remains a structure $$AsGa^{N+}—Ge^{P}—AsGa^{N}$$

in which transistors can be cut out by the usual methods.

The electrodes are well separated and it is easy to know where the connection leads are to be soldered.

What I claim is:

1. An heterojunction semi-conductor device comprising at least one semi-conductive crystalline region constituted by a binary semi-conductor material having substantially the same crystal lattice and interatomic distance as crystalline germanium and a melting point higher than that of germanium, said material being selected from the group consisting of gallium arsenide and indium phosphide and at least another semi-conductive region constituted by a epitaxially deposited re-solidified germanium crystal which is grown parallel onto said crystalline region from a molten body.

2. An heterojunction semi-conductive device comprising one inner semi-conductive crystalline base region constituted by a binary semi-conductor material having substantially the same crystal lattice and interatomic distance as crystalline germanium and a melting point higher than that of germanium, said material being selected from the group consisting of gallium arsenide and indium phosphide and two outer semi-conductive emitter and collector regions constituted by two re-solidified epitaxially deposited germanium crystals on one side and the other, said germanium crystals being grown parallel onto said crystalline base region from a molten body.

3. An heterojunction semi-conductor device comprising two outer semi-conductive crystalline emitter and collector regions constituted by a binary semi-conductor material having substantially the same crystal lattice and interatomic distance as crystalline germanium and having a melting point higher than that of germanium, said material being selected from the group consisting of gallium arsenide and indium phosphide and one inner semi-conductive base region constituted by an epitaxially deposited re-solidified germanium crystal inserted between and grown parallel onto said crystalline emitter and base regions from a molten body.

References Cited in the file of this patent

UNITED STATES PATENTS

| | | |
|---|---|---|
| 2,623,102 | Shockley | Dec. 23, 1952 |
| 2,767,358 | Early | Oct. 16, 1956 |
| 2,798,989 | Welker | July 9, 1957 |
| 2,822,310 | Stieltjes et al. | Feb. 4, 1958 |
| 2,846,340 | Jenny | Aug. 5, 1958 |
| 2,847,335 | Gremmelmaier et al. | Aug. 12, 1958 |
| 2,855,334 | Lehovec | Oct. 7, 1958 |

FOREIGN PATENTS

| | | |
|---|---|---|
| 719,873 | Great Britain | Dec. 8, 1954 |
| 1,184,921 | France | Feb. 9, 1959 |

OTHER REFERENCES

Schillmann: A. Naturforschg., 11*a*, pages 463–472, 1956.

Kolm et al.: Physical Review, vol. 108, No. 4, November 15, 1957, pages 965–971.

Notice of Adverse Decision in Interference

In Interference No. 93,886 involving Patent No. 3,057,762, F. F. Gans, Heterojunction transistor manufacturing process, final judgment adverse to the patentee was rendered Nov. 10, 1964, as to claim 1.

[*Official Gazette December 22, 1964.*]